US007501967B2

(12) United States Patent
Draxelmayr et al.

(10) Patent No.: US 7,501,967 B2
(45) Date of Patent: Mar. 10, 2009

(54) ANALOG-TO-DIGITAL CONVERTER OPERABLE WITH STAGGERED TIMING

(75) Inventors: Dieter Draxelmayr, Villach (AT); Gernot Kubin, Graz (AT); Christian Vogel, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/244,569

(22) Filed: Oct. 6, 2005

(65) Prior Publication Data

US 2006/0097901 A1     May 11, 2006

(30) Foreign Application Priority Data

Oct. 8, 2004    (DE) ................... 10 2004 049 161

(51) Int. Cl.
    *H03M 1/00*    (2006.01)
(52) U.S. Cl. ........................ 341/141; 341/155
(58) Field of Classification Search ......... 341/118–120, 341/140–172, 141; 327/291–295
See application file for complete search history.

(56) References Cited

U.S. PATENT DOCUMENTS

| | | | | |
|---|---|---|---|---|
| 4,968,988 A * | 11/1990 | Miki et al. | .................. | 341/141 |
| 5,294,926 A | 3/1994 | Corcoran | | |
| 6,351,227 B1 * | 2/2002 | Rudberg | .................... | 341/118 |
| 6,392,575 B1 * | 5/2002 | Eklund | .................... | 341/141 |
| 6,522,282 B1 * | 2/2003 | Elbornsson | ................ | 341/141 |
| 6,542,017 B2 * | 4/2003 | Manganaro | ................ | 327/291 |
| 6,570,410 B2 * | 5/2003 | Manganaro | ................ | 327/94 |
| 6,771,203 B1 | 8/2004 | Narin | | |
| 7,049,994 B2 * | 5/2006 | Tsujita | ........................ | 341/155 |
| 7,245,638 B2 * | 7/2007 | Agazzi et al. | ................ | 370/516 |

| | | |
|---|---|---|
| 2004/0032358 A1 | 2/2004 | Asami |

FOREIGN PATENT DOCUMENTS

JP    09-252251 A    9/1997

OTHER PUBLICATIONS

William C. Black Jr, Time Interleaved Converter Array, Dec. 1980, IEEE, vol. SC-15, No. 6.*

(Continued)

*Primary Examiner*—Lam T. Mai
(74) *Attorney, Agent, or Firm*—Brinks Hofer Gilson & Lione

(57)    ABSTRACT

An arrangement for a time interleaved analog-to-digital converter that converts an signal to a digital signal and has a converter array with a plurality of analog-to-digital converters arranged in a fixed sequence in parallel with one another and can be operated with staggered timing with respect to one another is disclosed. The arrangement has a connection network which, for the purposes of actuation with staggered timing, generates in each case one control signal for an individual analog-to-digital converter in each case, with the connection network predefining the time sequence with which the control signals actuate the individual analog-to-digital converters in such a way that owing to this sequence of the control signals and thus the sequence of the actuated individual analog-to-digital converters there is at least a reduction in an interference spectrum in the spectrum of the input and/or output signal. A sorting method for operating this analog-to-digital converter is also disclosed.

19 Claims, 10 Drawing Sheets

OTHER PUBLICATIONS

William C. Black Fr, Time Interleaved Converter Arrays, Feb. 13, 1980, IEEE, Continental Ballroom 45.*

William C. Black Jr, Time Interleaved Converter Array, Dec. 1980, IEEE, vol. SC-15, No. 6.*

William C. Black Fr, Time Interleaved Converter Arrays, Feb. 13, 1980, IEEE, Continental Ballroom 45.*

Mamoru Tamba, Atsushi Shimizu, Hideharu Munakata, Takanori Komuro; A Method to Improve SFDR with Random Interleaved Sampling Method; Agilent Technologies Japan, Ltd; ITC International Test Conference; 2001; IEEE; Paper 18.3; pp. 512-520.

K. El-Sankary, A. Assi, M. Sawan; New Sampling Method to Improve the SFDR of Time-Interleaved ADCs; PolySTIM Neurotechnology Laboratory, Ecole polytechnique de Montreal, Department of Electrical Engineering, Montreal, Canada; 2003; IEEE; pp. 1-833-I-836.

Daihong Fu, Kenneth C. Dyer, Stephen H. Lewis, Paul J. Hurst; A Digital Background Calibration Technique for Time-Interleaved Analog-to-Digital Converters; Dec. 1998; IEEE Journal of Solid-State Circuits; vol. 33, No. 12; pp. 1904-1910.

Shafiq M. Jamal, Daihong Fu, Nick C.-J. Chang, Paul J. Hurst, Stephen H. Lewis, A 10-b 120-MSample/s Time-Interleaved Analog-to-Digital Converter With Digital Background Calibration; Dec. 2002, IEEE Journal of Solid-State Circuits; vol. 37, No. 12; pp. 1618-1626.

Huawen Jin, Edward Lee, Marwan Hassoun; Time-Interleaved A/D Converter with Channel Randomization; Department of Electrical Engineering and Computer Engineered Iowa State University, Ames, IA; Jun. 9-12, 1997; IEEE International Symposium on Circuits and Systems; Hong Kong; pp. 425-428.

German Office Action dated Jun. 8, 2005.

El-Sankary, K., Assi, A., Swan, M.; New Sampling Method to improve the SFDR of time-interleaved ADCs. In: Proceedings of the 2003 International Symposium on Circuits and Systems, 2003, vol. 1, S. I-833 - I-836.

* cited by examiner

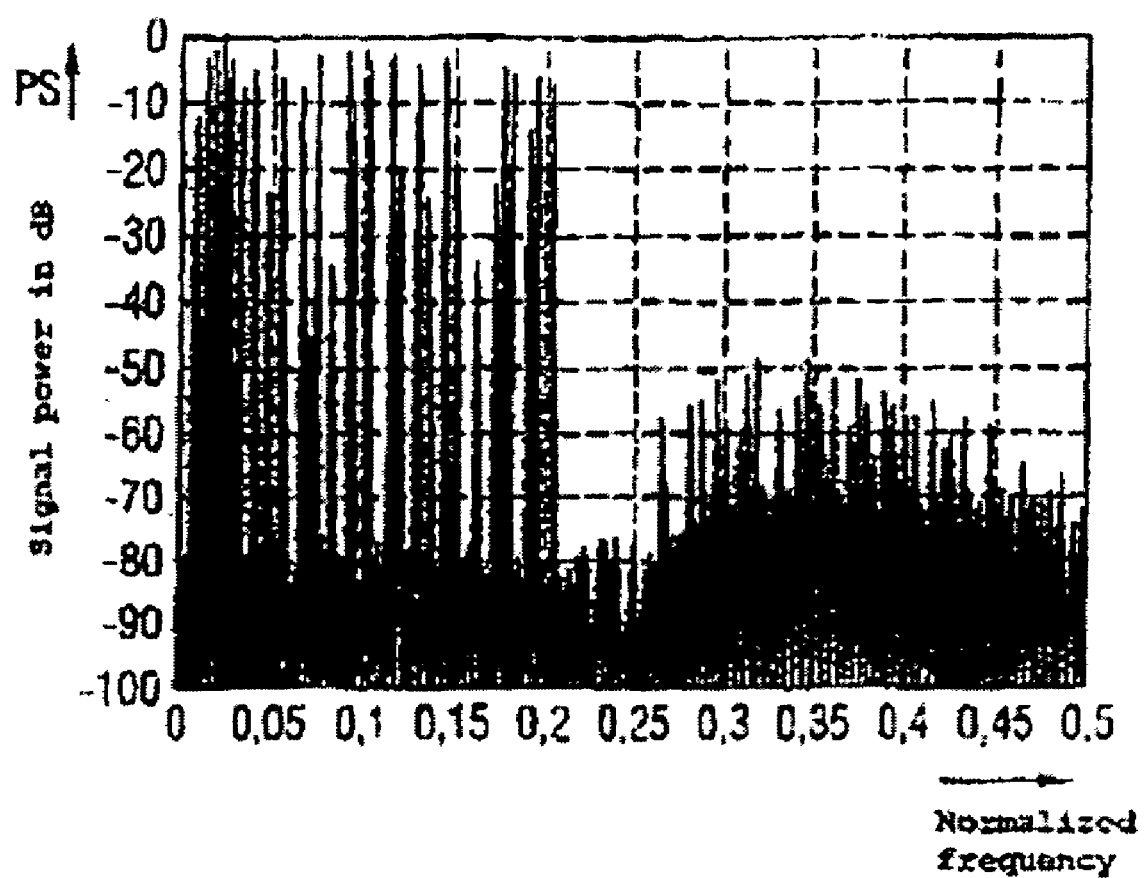

ANALOG-TO-DIGITAL CONVERTER OPERABLE WITH STAGGERED TIMING

PRIORITY AND CROSS REFERENCE TO RELATED APPLICATION

This application claims priority to German Patent Application No. 10 2004 049 161.5, filed Oct. 8, 2004, which is incorporated by reference herein in its entirety.

BACKGROUND OF THE INVENTION

1. Field of the Invention

The invention relates to a time interleaved analog-to-digital converter, and to a sorting method for operating this analog-to-digital converter.

2. Description of the Related Art

In modern data processing there is a need to process increasingly large amounts of data in shorter and shorter times and to condition it for further data communication. The respective electronic components, for example memory modules, processors and also logic components, such as PLDs or FPGAs, are therefore configured for increasingly high clock frequencies. As a result of this the analog-to-digital converters (ADC) which are present in such electronic components have correspondingly high sampling rates.

An analog-to-digital converter which has been gaining in importance recently owing to its high sampling rate is what is referred to as the time interleaved analog-to-digital converter (TIADC) in the relevant literature, or is termed a converter array for short. The design and the method of operation of such a time interleaved analogue, to digital converter, referred to below for short as TIADC, is described in Black, W. C., Hodges, D. A., *Time Interleaved Converter Arrays*, IEEE Journal of Solid-State Circuits, volume 15, number 6, pages 1022-1029, 1980.

In the simplest case, a TIADC has two analog-to-digital converters which are arranged in parallel with one another as a component of a converter array, said analog-to-digital converters carrying out alternate time interleaved sampling of a common analogue input signal and making it available in digital form. This parallel connection and the alternate operation of the converters which are arranged in parallel makes the sampling rate and conversion rate of the entire TIADC appear doubled compared to the sampling rate of the individual parallel ADCs. Generally, a TIADC may be composed of any desired number of ADCs which are arranged in parallel with one another.

FIG. 1 is a schematic circuit diagram showing the design of a known TIADC. The time interleaved ADC has a converter array with N ADCs 2-1 to 2-N which are arranged in parallel with one another and which are connected at the input ends to the input 4 and at the output ends to an input of a multiplexer 3. The analogue input signal XIN is fed to the individual ADCs 2-1 to 2-N, usually also referred to as ADC channels, said input signal XIN being sampled by the individual ADCs 2-1 to 2-N with a certain time offset and digitized. The individual digital signals of the ADCs 2-1 to 2-N are combined by means of the multiplexer 3 so that a higher sampling rate is effectively obtained for the digital output signal XOUT at the output 5. The effective sampling rate of the TIADC is ideally increased to N-times the sampling rate of an individual ADC 2-1 to 2-N.

The individual ADCs 2-1 to 2-N are arranged in a physically fixed fashion, that is to say can no longer be shifted, within the converter array after their manufacturing process. However, with such an array of individual ADCs 2-1 to 2-N there is a problem that any type of incorrect adaptation (mismatch) of the individual ADCs 2-1 to 2-N to one another leads to a conversion error which affects the output signal XOUT. Such incorrect adaptation may depend on various parameters which are briefly described below:

For example, when a plurality of individual ADCs 2-1 to 2-N are used within one converter array there is a time offset between the individual converters. A time offset is defined as a deviation from the ideal sampling time (also referred to as a delay mismatch, timing mismatch or aperture delay mismatch). Different time offset values of the individual ADCs 2-1 to 2-N lead however to an undesired interference spectrum in the output signal XOUT. For the frequency of this interference spectrum, the following relationship applies for a sinusoidal input signal with the frequency fe:

$$\pm fe + (m*fs/N),$$

where fs is the sampling frequency, N is the number of converters and m=[0 ... N-1] is an integral multiple. Especially at high frequencies, the intervals or timing differences of adjacent converters become smaller and smaller so that the time offset problem becomes more and more pronounced here.

In the same way, differences in the amplification of the input signal lead to undesired additional spectrums whose frequency is however dependent on the input signal. Incorrect adaptations in the bandwidth of the individual parallel ADCs of the converter array typically give rise to undesired additional interference spectrums. Overall it is therefore to be noted that the individual parallel ADCs typically have usually small but different properties, which generally has a negative effect on the properties of the entire converter arrangement. In particular, any form of deviation in the transmission behaviour and thus in the transmission function of the individual AD leads to additional undesired interference spectrums in the output signal.

FIG. 2 shows the output spectrum PS of a time interleaved ADC for the case N=8, that is to say when 8 parallel ADCs are used. The reference number 6 refers to the input spectrum which is obtained from the conversion of the input signal XIN. This input spectrum 6 is predefined and does not change as a result of a change in the channel sequence. In addition to this input spectrum 6, additional spectrums 7 are also present, at the interval fs/N. These additional spectrums 7 which result from the abovementioned incorrect adaptations of the individual converters, constitute authentic copies of the input spectrum 6 which results from the input signal XIN and thus also contain the properties of the input signal XIN. The power which is contained in these additional spectrums 7 is, as illustrated in FIG. 2, distributed more or less randomly owing to the random incorrect adaptations and is also located in the region of the spectrum 6 for the input signal XIN. However, this is undesired, in particular if the power of these additional spectrums 7 in the region of the input spectrum 6 is very large.

The problem of incorrect adaptation, and in particular the incorrect adaptation resulting from different time offset values increases with increasingly small structure sizes such as are used in future manufacturing technologies in what is referred to as the deep submicron range with structure widths of less than 70 nm since absolute errors have increasingly serious effects there owing to the smaller structural widths. The need for power optimization of the individual ADCs of a time interleaved analog-to-digital converter is becoming more and more significant, in particular for these future manufacturing technologies.

The incorrect adaptations mentioned above can be avoided and/or reduced, on the one hand, by analogue circuit measures or by digital. standardization methods which will be described briefly below:

Analogue circuit measures for reducing incorrect adaptations entail a very high level of complexity of circuitry together with a very high power consumption, if such a reduction is at all possible, in particular when there are a plurality of individual ADCs of one converter array. These circuit measures are based on avoiding circuit errors by, for example, implementing very precise clock generation for the actuation of the individual ADCs of the converter array so that the time offset problem does not arise at all. In particular at very high frequencies this solution is however very difficult to implement at acceptable cost.

The digital standardization methods described, for example in Fu, D., Dyer, W. C., Lewis, S. H., Hurst, P. J., "*A Digital Background Calibration Technique for Time Interleaved Analogue-to-Digital Converters*," IEEE Journal of Solid-State Circuits, volume 33, number 12, pages 1904-1911, 1988, and Jamal, S. M., Daihong, F., Chang, N. C. J., Hurst, P. J., Lewis, S. H., "*A 10-b 120-{M}sample/s time-Interleaved analogue-to-digital converter with digital background calibration*," IEEE Journal of Solid-State Circuits, volume 37, number 12, pages 1618-1627, 2002, solve the problem of amplification adaptation (see Dyer et al.) and of the time offset in correct adaptation (see Jamal et al.). The precision of these digital methods depends however directly on how precise the respective parameter, that is to say the amplification and the time offset error, are determined, that is to say how precise the error identification is. In order to determine and thus also correct sampling time error adaptations there are currently only very costly numeric methods which are capable of being implemented with an exorbitantly high computational complexity, which far exceeds acceptable limits, in particular when a plurality of individual ADCs of one TIADC are used. Above all, the correction which has to take place during the ongoing operation of the TIADC constitutes a hurdle which is frequently impossible to overcome technically owing to the necessary computing power therefor. For this reason, this method of error compensation is frequently not practical.

For these reasons, an error reduction process, which is intended to reduce the effects of an incorrect adaptation, is very frequently performed. In documents Jin, H., Lee, E. K. F., Hassoun, M., "*Time-Interleaved (A/D) Converter with Channel Randomization*", Proceedings of 1997 {IEEE} International Symposium and Circuits on Systems, volume 1, pages 425-428, 1997; Tamba, M., Shimizu, A., Munakata, H., Komuro, T., "*A Method to Improve (SFDR) with Random Interleaved Sampling Method*," International Test Conference, Proceedings, pages 512-520, October 2001; and El-Sankary, K., Assi, A., Sawan, M, "*New Sampling Method to Improve the (SFDR) of Time-Interleaved (ADCs)*," Proceedings of the 2003 International Symposium on Circuits and Systems, volume 1, pages 833-836, 2003, algorithms and circuit arrangements are described which are intended to bring a certain degree of randomness into the sequence of the individual ADCs during the parallel operation of these ADCs and thus to distribute the error spectrum generated by the incorrect adaptation. This introduced randomness in the sequence of the individual ADCs brings about the uniform distribution of the spectral power arising over the entire frequency band due to incorrect adaptations. However, a problem with these methods is that there is no effective improvement achieved in the signal-to-noise ratio since the undesired power is in fact not eliminated but merely distributed uniformly. Furthermore, this random distribution, which will be referred to below for short as randomization, is based on a greater or smaller number of sampled values which are however not present in short messages or surge-like signals such as what are referred to as signal bursts. For this reason, with such short signals there is usually insufficient stochastic distribution of the converters. Moreover, with this randomization method there are also certain restrictions which result from the physical peripheral conditions of the operation of the converter (setup and hold times).

SUMMARY OF THE INVENTION

Against this background, the present invention is therefore based on the object of optimizing the operating sequence of the individual ADCs of a converter array. The intention here is in particular to improve the output spectrum by means of an optimum sequence of the individual ADCs of a converter array.

An embodiment of the invention provides a converter arrangement, having a time interleaved analog-to-digital converter and has the purpose of converting an input signal into a digital output signal containing a converter array having a plurality of individual analog-to-digital converters which are arranged in a fixed sequence in parallel with one another and can be operated with staggered timing with respect to one another, having a connection network which, for the purposes of actuation with staggered timing, generates in each case one control signal for an individual analog-to-digital converter in each case, with the connection network predefining the time sequence with which the control signals actuate the individual analog-to-digital converters in such a way that owing to the sequence of the control signals and thus this sequence of the actuated individual analog-to-digital converters there is at least a reduction in, an interference spectrum in the spectrum of the output signal.

The object is also achieved in accordance with the invention by means of a sorting method for operating an inventive converter arrangement for spectral shaping of the spectrum of the output signal, having the method steps:

(a) a converter array having a plurality of individual analog-to-digital converters which are arranged in a fixed sequence and in parallel with one another is made available;

(b) at least a parameter which is necessary for an optimum sequence of the individual analog-to-digital converters within the converter array is determined;

(c) a sequence of the individual analog-to-digital converters with which they are actuated with staggered timing is assigned in accordance with the determined parameter or parameters.

The idea on which the present invention is based consists in the fact that when there are various time interleaved analog-to-digital converters for each individual converter array a predetermined sequence of the converters is predefined which is the optimum sequence particularly for this converter array, with the aim of performing spectral shaping of the output power caused by incorrect adaptations. The realization on which the invention is based is that the power of the incorrect adaptations of a time interleaved analog-to-digital converter can be subjected to spectral shaping and thus optimized by defining a predetermined sequence of the individual ADCs for each individual converter array.

In this context, a respective incorrect adaptation of the time interleaved analog-to-digital converter is identified (error identification) in a measuring cycle. This measuring cycle can be carried out at any desired time, that is to say while the time interleaved analog-to-digital converter is operating or even already during its manufacture. Specific parameters are predefined for this measuring cycle, by means of which parameter or parameters the optimum converter sequence is determined. In this way it is possible, after an error identification process, to perform error reduction during which the output spectrum of the time interleaved analog-to-digital converter can be subjected to spectral shaping as a function of the predefined parameter or parameters.

For the spectral shaping the energy or the power of the undesired interference spectrums which are present in addition to the useful spectrum is shifted to specific points of the output spectrum so that it can be subsequently filtered out there by means of a suitable filter (digital or analogue). By means of suitable measures such as, for example, oversampling and/or filtering of the input signal, it is possible to obtain a spectrum into which the undesired interference spectrums can be shifted, that is to say a spectrum outside the useful spectrum (useful band) of the output signal. As a consequence of this, the useful band of the output signal has a lower proportion of the interference spectrum. This is achieved overall by virtue of the fact that the sequence of the individual analog-to-digital converters of the converter array are actuated in an optimized sequence time offset with respect to one another in relation to the spectrum, that is to say an optimized sequence for the actuation of the analog-to-digital converters of the converter array is predefined here.

This spectral shaping of the output spectrum by predefining the optimized converter sequence is particularly effective if only a single type of parameters is the main cause of the incorrect adaptation. This individual parameter may be, for example, in particular the time offset error which can only be identified and corrected at great expense with conventional methods.

One advantage of the present invention may also be that a very low level of circuit complexity is necessary to reduce the incorrect adaptation in the output spectrum. In particular, the circuit complexity which results for the reduction of the incorrect adaptation is restricted to a connection network which can be configured at least once in order to implement the respective optimum converter sequence. In particular even when there is an increasing number of parallel individual analog-to-digital converters, the additional cost is low. All that is necessary here is a small amount of additional expenditure on sorting the individual analog-to-digital converters.

In this way the present invention is independent of the absolute precision of an identification algorithm such as is performed in known approaches to solutions which are acknowledged at the beginning. Although the present invention, accepts a certain degree of incorrect adaptation, the expenditure on circuitry and the computational complexity for reducing the incorrect adaptation is reduced greatly compared to previous approaches to solutions. As a result, the circuit arrangement according to the invention is very economical in terms of power but at the same time supplies a very precise conversion result.

In a first version of the inventive converter, the connection network has at least a clock input into which at least a clock signal can be input. The connection network generates, from the input clock signals, clocked control signals which have a predetermined time difference with respect to one another and are used to actuate the individual analog-to-digital converters.

In a second version of the inventive converter, at least three, preferably at least four individual analog-to-digital converters are provided which are each connected by their signal path to an input of the converter arrangement in order to pick-up an analogue input signal present at the input, sample the picked-up input signal and convert it into digital intermediate signals. The invention is particularly advantageous and effective in art analog-to-digital converter with a very large number of individual analog-to-digital converters such as, for example, 128 or 256 individual analog-to-digital converters within one converter array.

A filter may be connected downstream of the converter arrangement and filters the output signal in order to filter out the energy from undesired interference spectrums, present in addition to the useful spectrum, from the spectrum of the output signal. A low-pass filter is preferably provided as a filter for low-pass filtering.

In third version of the inventive converter, the connection network has a counter which is triggered by a central clock signal and which generates a counter sequence. Each individual analog-to-digital converter has connected in front of it at the control end at least an actuation circuit which assigns in each case one counter reading of the counter sequence generated by the counter to each individual analog-to-digital converter. The actuation circuit may in each case have a memory register and a comparator, with the comparator being configured to compare the counter sequence with a register content which is stored in, the memory register.

In fourth version of the inventive converter, a measuring device is provided which determines the properties of the individual analog-to-digital converters and/or the parameters which influence the output spectrum, and said measuring device makes available at the output end a measurement signal which is derived therefrom. The measuring device is configured to pick-up the input signal and/or the output signal and, if appropriate, to determine the output spectrum of these signals therefrom for the purpose of determining the properties of the individual analog-to-digital converters and/or for the purpose of determining the parameters which influence the output spectrum. These parameters may be, for example, a time offset error between the individual converters, differences in the amplification of the input signal, incorrect adaptations in the bandwidth of the individual parallel ADCs etc. Basically, any parameters which allow conclusions to be drawn about the properties of the individual digital converters may be used here.

An evaluation device may be provided which evaluates the measurement signal of the measuring device and generates, as a function of this evaluation, setting signals for actuating and setting in an optimum way the connections of the connection network. The evaluation device is preferably embodied as a program-controlled device, in particular as a microprocessor or as a micro controller.

The connection network may have invariable connection devices which are generated, for example, by means of a diffusion process or implantation process during the manufacture of the converters.

The connection network may have variable connection devices which can be varied by means of controllable switches, for example MOSFETs or bipolar transistors.

In a fifth version of the inventive converter, at least a first group of individual analog-to-digital converters is provided in which the sequence of the individual analog-to-digital converters is assigned in accordance with a reduction in an interference spectrum in the output spectrum of the output signal. In addition, at least a second group of individual analog-to-digital converters is provided in which an assignment of the sequence of the individual analog-to-digital converters is provided according to the randomization method.

In a sixth version of the inventive method, the determined parameters are derived from the properties of the individual analog-to-digital converters. The determined parameters are preferably derived from the input signal and/or the output signal, for example by determining and evaluating the spectrum of the output signal. Additionally or alternatively, it is also possible to derive the determined parameters from the amplification, the time offset, the sampling time and/or the bandwidth of the individual analog-to-digital converters. A further advantage of the present invention is that the individual parameters in the respective individual converters of the converter array do not need to be determined precisely. To implement optimum spectral shaping of the output spectrum it is completely sufficient to know whether a parameter value is larger or smaller than the average value. If the individual parameter values can be additionally differentiated from one another and if the parameter values are therefore known sufficiently precisely, the corresponding converters can also be very easily sorted. As a result, the spectral shaping of the output spectrum can be additionally optimized.

In a first advantageous embodiment of the inventive method, a first group and at least a second group of individual analog-to-digital converters are provided. In order to determine an optimized sequence of the individual analog-to-digital converters, individual analog-to-digital converters of the first group and individual analog-to-digital converters of the at least one second group are selected alternately, with the selection of an individual analog-to-digital converter being carried out randomly within a respective group.

In a second advantageous embodiment of the inventive method, a plurality of groups of optimized sequences is made available for the individual analog-to-digital converters of a converter array. Each of these groups thus already has a more or less optimized sequence of the individual analog-to-digital converters. After a predetermined number of conversion cycles, in particular after each conversion cycle, a new group is selected for the subsequent conversion cycle or cycles, with this selection also being made randomly.

In a third advantageous embodiment of the inventive method, at least a first group of individual analog-to-digital converters is provided in which the sequence of the individual analog-to-digital converters is assigned in accordance with the determined sequence, in particular in accordance with a reduction in an interference spectrum in the output signal. In addition, at least one second group of individual analog-to-digital converters is provided in which the sequence of the individual analog-to-digital converters is assigned according to the randomization method. What is referred to as the randomization method is thus mixed here with the method according to the invention for spectral shaping described here so that the advantages of the two methods can be combined with one another very effectively.

DESCRIPTION OF THE PREFERRED EMBODIMENTS

Figure 1:
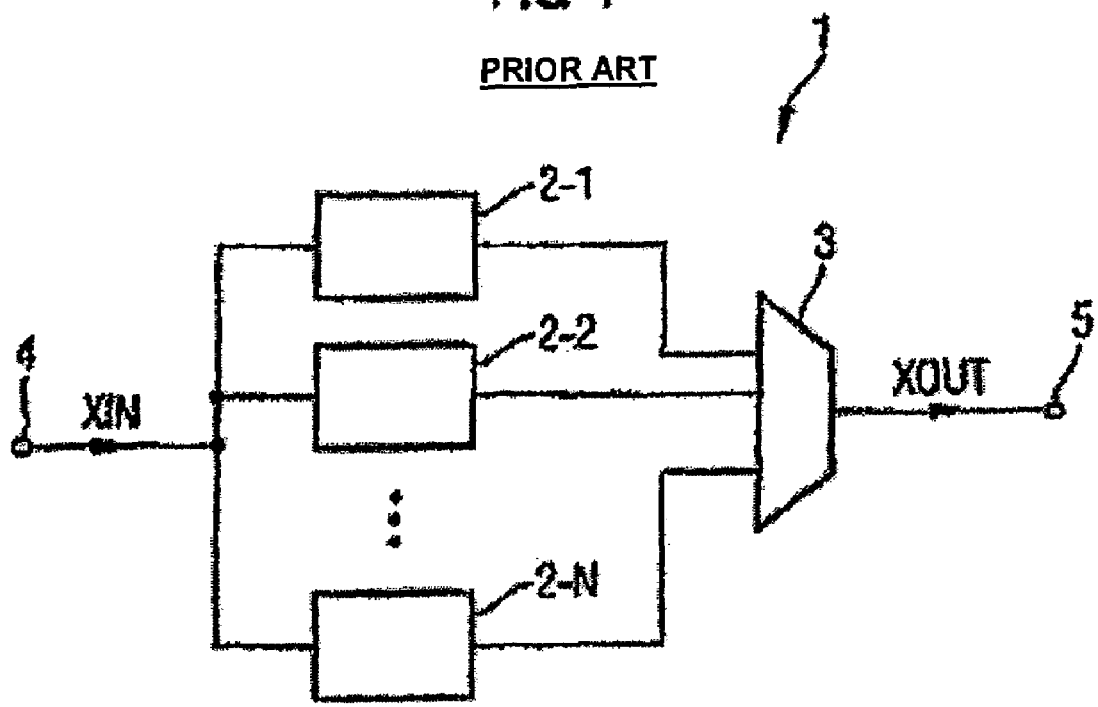
FIG. 1, as discussed above is a block circuit diagram showing the design of a known time interleaved analog-to-digital converter.

Identical or functionally identical elements and signals are referred to with the same reference symbols in the figures of the drawing unless stated otherwise.

Figure 3:
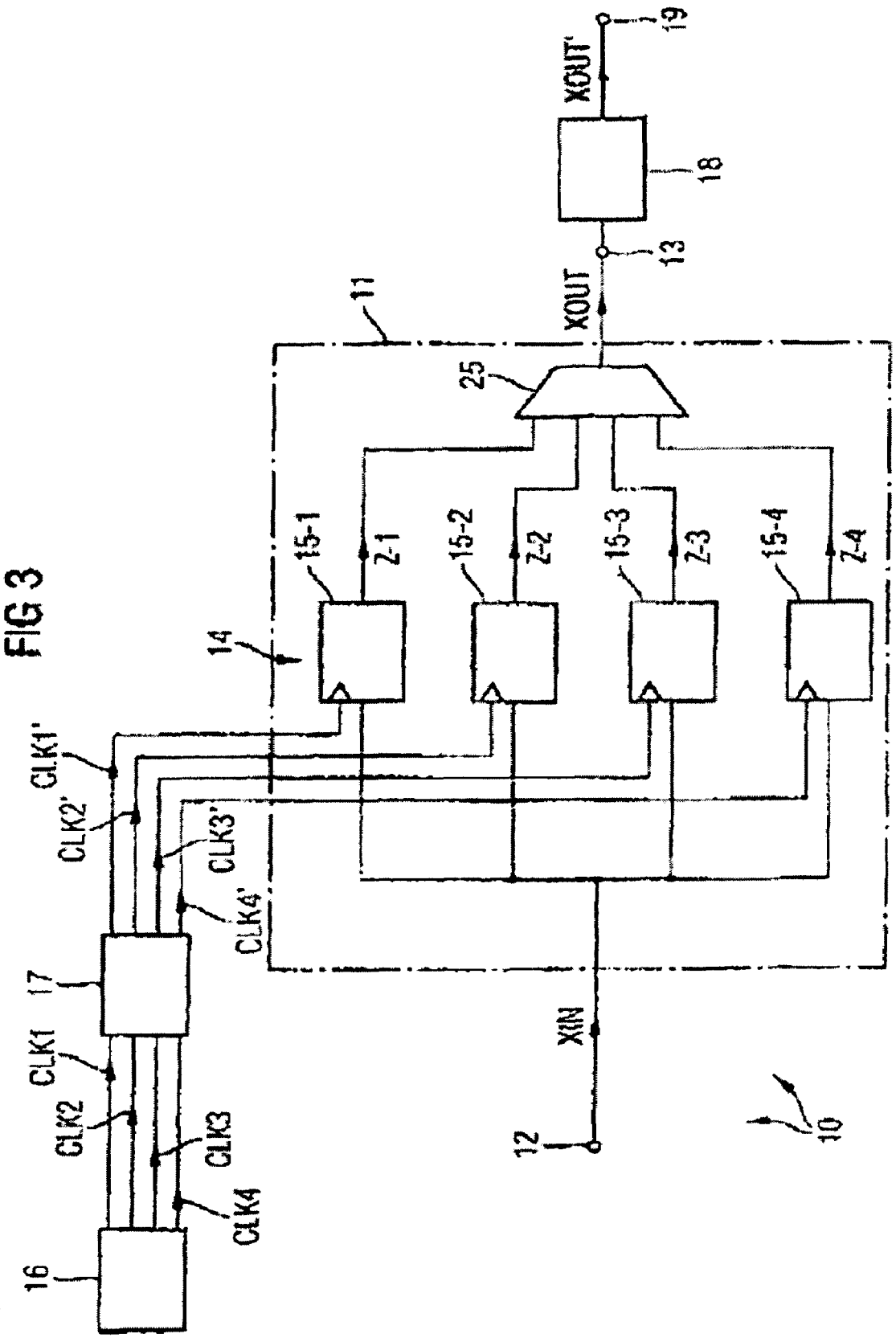
FIG. 3 is a block circuit diagram of a first, general exemplary embodiment of a circuit arrangement according to the invention with time interleaved analog-to-digital converter.

In FIG. 3, the circuit arrangement according to the invention is referred to by reference symbol 10. The circuit arrangement 10 contains a time interleaved analog-to-digital converter 11 which is connected at the input side to an input terminal 12 and at the output side to an output terminal 13. The analog-to-digital converter 11 has a converter array 14 which is composed in the present exemplary embodiment of four individual analog-to-digital converters 15-1 to 15-4 which are also referred to below as ADC channels 15-1 to 15-4. In FIG. 3, N=4 is therefore true. The individual analog-to-digital/convertors 15-1 to 15-4 are arranged in parallel with one another in the present exemplary embodiment, that is to say they are each connected at the input ends to the input 12 and at the output ends to the output 13 via a multiplexer 25. The individual digital signals Z-1 to Z-5 which are generated at the output ends by the individual analog-to-digital converters 15-1 to 15-4 of the converter array 14 are combined again by means of the multiplexer 25 in order to generate the digital output signal XOUT. A filter 18 which is embodied, for example, as a low-pass filter and which performs (low-pass) filtering of the output signal XOUT so that the (low-pass) filtered output signal XOUT' can be tapped at a taps 19, is connected downstream of the analog-to-digital converter 11 ox its multiplexer 25, at the output end.

The individual ADCs 15-1 to 15-4 each have a control input via which they can be actuated with a time offset with respect to one another. For this purpose the circuit arrangement 10 has a clock generating device 16 which, for the actuation of the individual ADCs 15-1 to 15-4, generates four different clock signals CLK1 to CLK4 which are used for the time interleaved actuation of the various individual ADCs 15-1 to 15-4.

The sequence of the individual ADCs 15-1 to 15-4, referred to in FIG. 3 by the numbering, is permanently predefined within the converter array 14. Without further measures, the individual ADCs 15-1 to 15-4 are actuated with a time offset by the corresponding clock signals CLK1 to CLK4 according to a permanently predefined sequence which corresponds, for example, to the arrangement in the converter array 14, irrespective of how pronounced the individual incorrect adaptations, such as time offsets error, differences in amplification, differences in sampling time and the bandwidth, are.

According to the invention, a connection network 17 is then provided which is arranged between the clock generating device 16 and the respective control inputs of the individual ADCs 15-1 to 15-4 of the analog-to-digital converter 11. The connection network 17 generates, from the clock signals CLK1 to CLK4, clock signals CLK1' to CLK4' which correspond at the output end and by means of which the individual ADCs 15-1 to 15-4 can be actuated.

According to the invention, the connection network is a freely configurable design, that is to say even though the individual ADCs 15-1 to 15-4 are permanently predefined within the converter array 14, the sequence of the ADC channels 15-1 to 15-4 of the converter array 14 can be correspondingly configured when specific parameters (incorrect adaptations) such as the time offset error, amplification error etc., are varied in the case of time interleaved actuation. This is done according to the invention by the configurable connection network 17 correspondingly changing the sequence of the ADC channels 15-1 to 15-4 of the converter array 14 by, for example, the connection network 17 generating, at the output end, clock signals CLK1' to CLK4' which predefines a corresponding sequence of these ADC channels 15-1 to 15-4 when the corresponding individual ADCs 15-1 to 15-4 are actuated. This predefining process may be implemented, for example, by a corresponding internal connection of the inputs and outputs of the connection network 17 or alternatively also by correspondingly delaying the clock signals CLK1 to CLK4.

Figure 4:
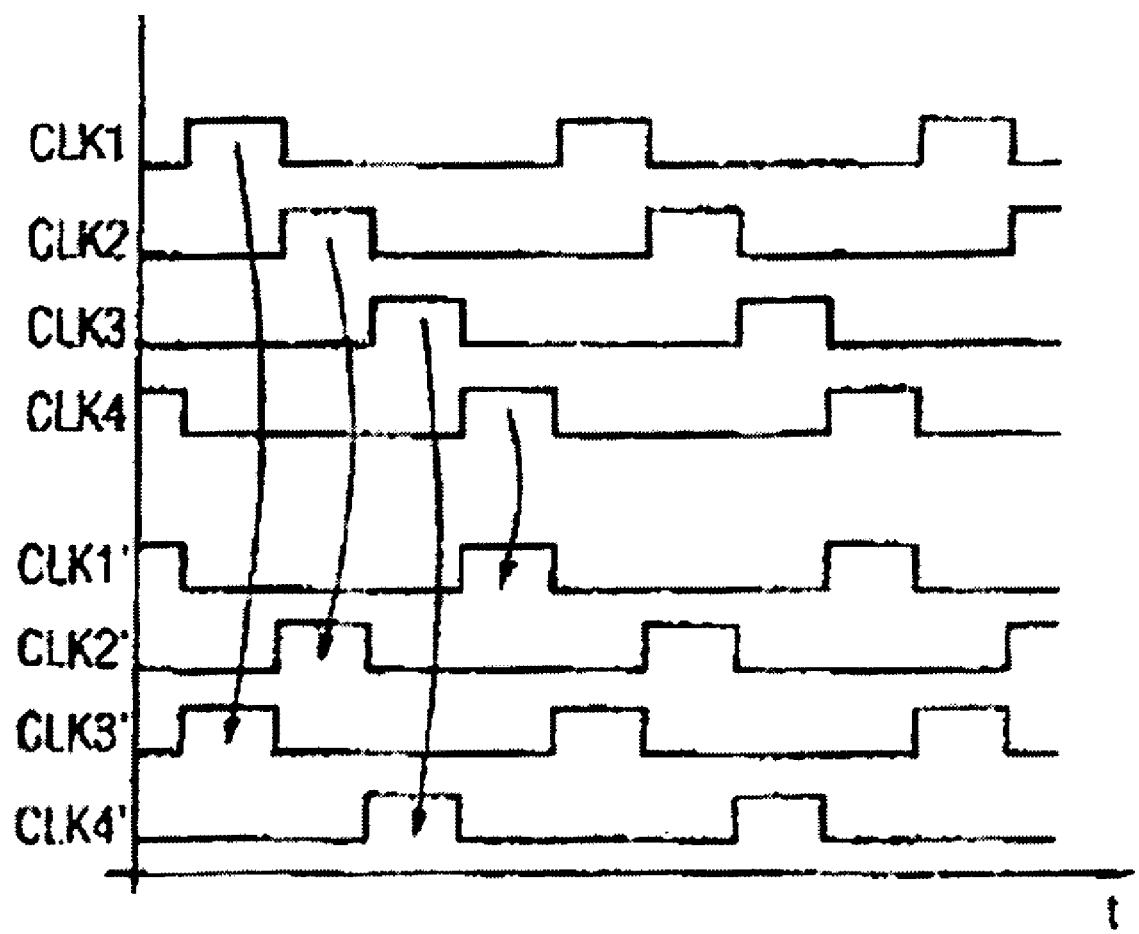
FIG. 4 is a signal/time diagram illustrating the function of the connection network from FIG. 3.

This will be illustrated by means of a signal/time diagram in FIG. 4. The clock signals CLK1 to CLK4 which are generated during the generation of the clock provide for the ADC channels 15-1 to 15-4 to have been actuated in a time interleaved fashion (without further measures) in the sequence starting with the individual ADC 15-1 and ending with the individual ADC 15-4. The connection network 17 then changes this sequence by changed assignment of the clock signals CLK1' to CLK4' derived from the clock signals CLK1 to CLK4, which has been indicated in FIG. 4 by the arrows. In the present exemplary embodiment, the individual ADCs 15-1 to 15-4 are now actuated in a time interleaved fashion by the connection network 17 in the sequence 15-3, 15-2, 15-4, 15-1. It is to be noted that this merely represents an exemplary sequence in order to illustrate the function of the connection network 17 according to the invention but any other desired sequence would also be conceivable provided that it is appropriate in terms of the current incorrect adaptation and the achievable optimum output spectrum.

Depending on the predefined sequence of the modified clock signals CLK1' to CLK4', corresponding paths are therefore connected to one another in the connection network 17 so that the order corresponds to the predefined sequence of the modified clock signals CLK1' to CLK4'. In the simplest case, the connection network can also constitute a pure through-contacting means provided that the sequence of the individual ADCs 15-1 to 15-4 of the converter array 14 already reflects a more or less optimum sequence.

Figure 5:
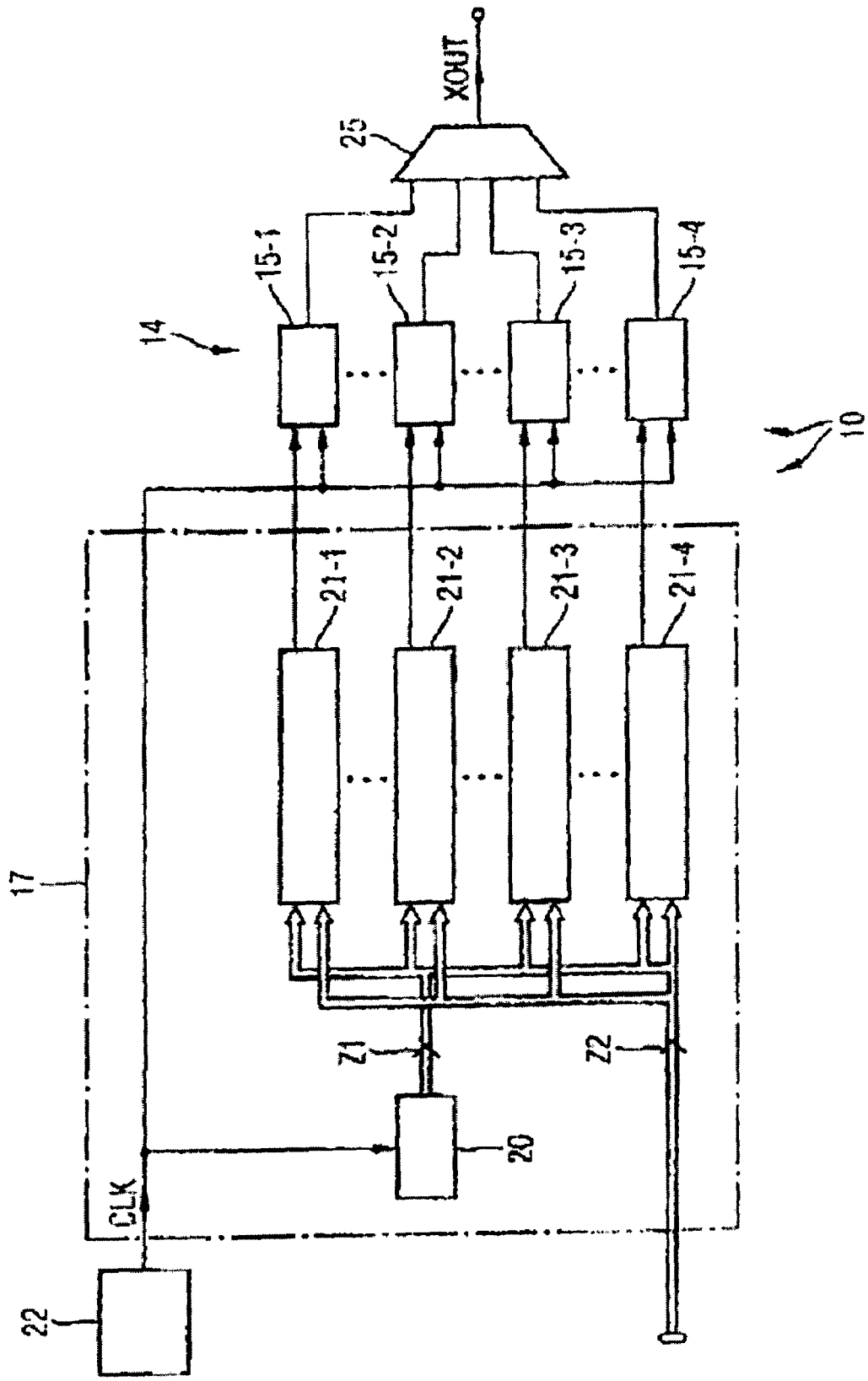
FIG. 5 is a block circuit diagram showing a second exemplary embodiment of the circuit arrangement according to the invention.

FIG. 5 shows a second, particularly advantageous exemplary embodiment of a circuit arrangement according to the invention. Here, the connection network 17 contains a counter 20 and in each case four actuation circuits 21-1 to 21-4. The counter 20 may be embodied here as a simple incrementing or decrementing counter. At the output end, the actuation circuits 21-1 to 21-4 are connected downstream of the counter 20, with one of the actuation circuits 21-1 to 21-4 being connected upstream of in each case one of the individual ADCs 15-1 to 15-4 of the converter array 14.

In addition, a clock generating device 22 is provided which—in contrast to the clock generating device 16 from FIG. 3—generates a single clock signal CLK. This clock signal CLK is input, on the one hand, into a respective clock input of the individual ADCs 15-1 to 15-4. In addition, this clock signal CLK is fed to the counter 20. The counter 20 generates a counter sequence Z1 at the output end. The counter sequence Z1 preferably corresponds to the number N=4 of the individual ADCs 15-1 to 15-4 of the converter array 14. The counter sequence Z1 is now indicated as a time slot information item from which a sampled value is to be extracted by the input signal XIN. According to the invention, a predetermined time slot is then assigned to this counter frequency Z1 to each of the individual ADCs 15-1 to 15-4. This is done, for example, by programming a specific time slot value into each of the actuation circuits 21-1 to 21-4. This programmed-in time slot value Z2 can be input by an external circuit arrangement (not illustrated in FIG. 5). A respective actuation circuit 21-1 to 21-4 is composed in each case of a memory register and a comparator. The comparator compares the counter reading Z1 with a register content stored in the memory register. If the counter reading Z1 and the register content correspond, the comparator sends a start pulse to the individual ADC 15-1 to 15-4 which is respectively connected downstream.

The respective individual ADC 15-1 to 15-4 is therefore activated whenever the counter sequence Z1 supplied by the counter corresponds to the programmed-in time slot value Z2. In this way, any desired converter sequence of the individual ADCs 15-1 to 15-4 can be implemented by means of simple statistical programming. No complicated clock control is necessary here but rather the presence of a simple clock signal CLK is sufficient to actuate the counter 20. All the individual ADCs 15-1 to Z5-4 are triggered here—in contrast to the exemplary embodiment in FIG. 3—by a central clock signal CLK. When this clock CLK becomes active is defined by means of the time slot controller of the counter 20 and the various actuation circuits 21-1 to 21-4.

Figure 2:
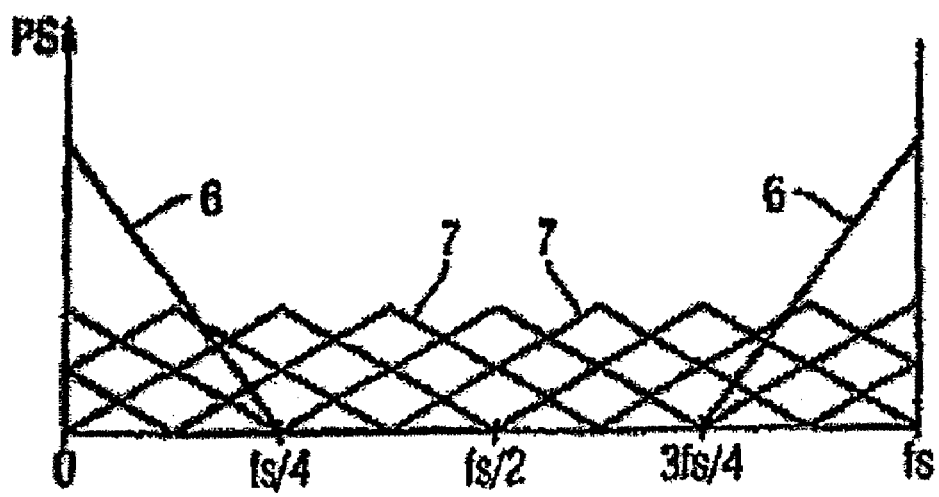
FIG. 2, as discussed above, shows the output spectrum of a time interleaved analog-to-digital converter which is configured, for example, according to FIG. 1, when four parallel ADCs are used.
Figure 6:
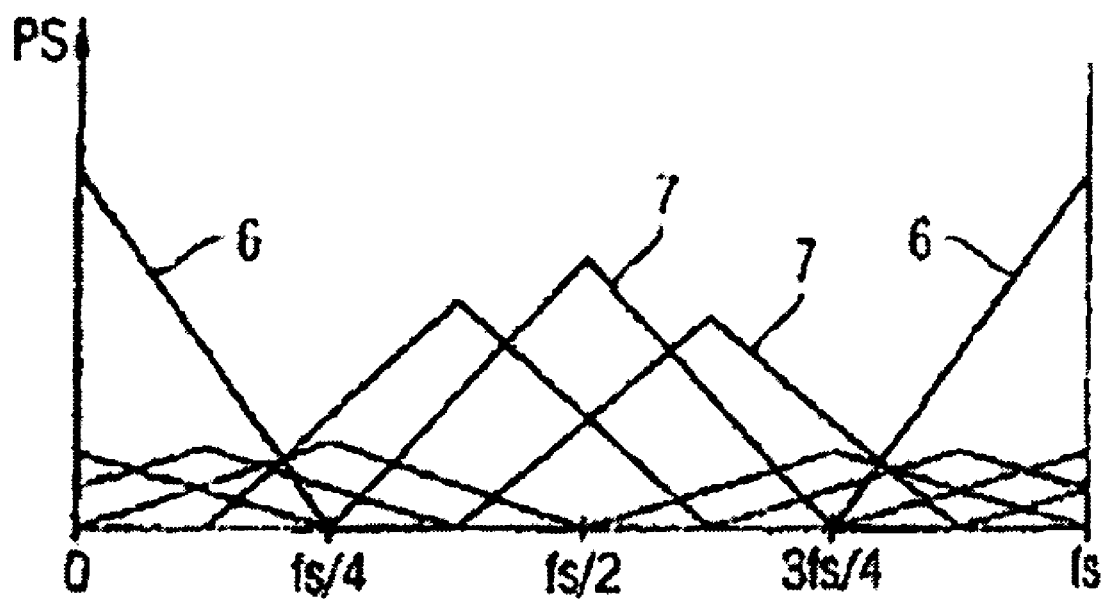
FIG. 6 shows the output spectrum of a time interleaved analog-to-digital converter according to the invention corresponding to the exemplary embodiments in FIGS. 3 and 5.

FIG. 6 shows the output spectrum PS for a circuit arrangement according to the invention with time interleaved analog-to-digital converters such as may be constructed, for example, in accordance with FIGS. 3 and 5. In contrast to the output spectrum PS from FIG. 2, spectral shaping of the undesired spectrums was carried out here by a specific selection of the channel sequence of the individual ADCs 15-1 to 15-4. It is to be noted that the output spectrum PS in FIG. 6 only constitutes a possible variant for spectra, shaping, but it can also be embodied differently depending on the desired application and requirements. The suitably selected sequence of the individual ADCs 15-1 to 15-4 selectively optimizes the corresponding coefficients of the additional spectrums 7 to the central pin at fs/2 or the pin (3*fs/8 and 5*fs/8) arranged to the left or right of it. However, it would also be conceivable for correspondingly different optimization to be performed on other pins, which may be advantageous in particular when a very large number of individual ADCs 15-1 to 15-4 axe used. Since the additional spectrums 7 are, as it were, arranged in the centre of the output spectrum PS around the fs/2 pin, they can very easily be filtered out by means of the filter 18 which is connected downstream at the output end.

Figure 7A:
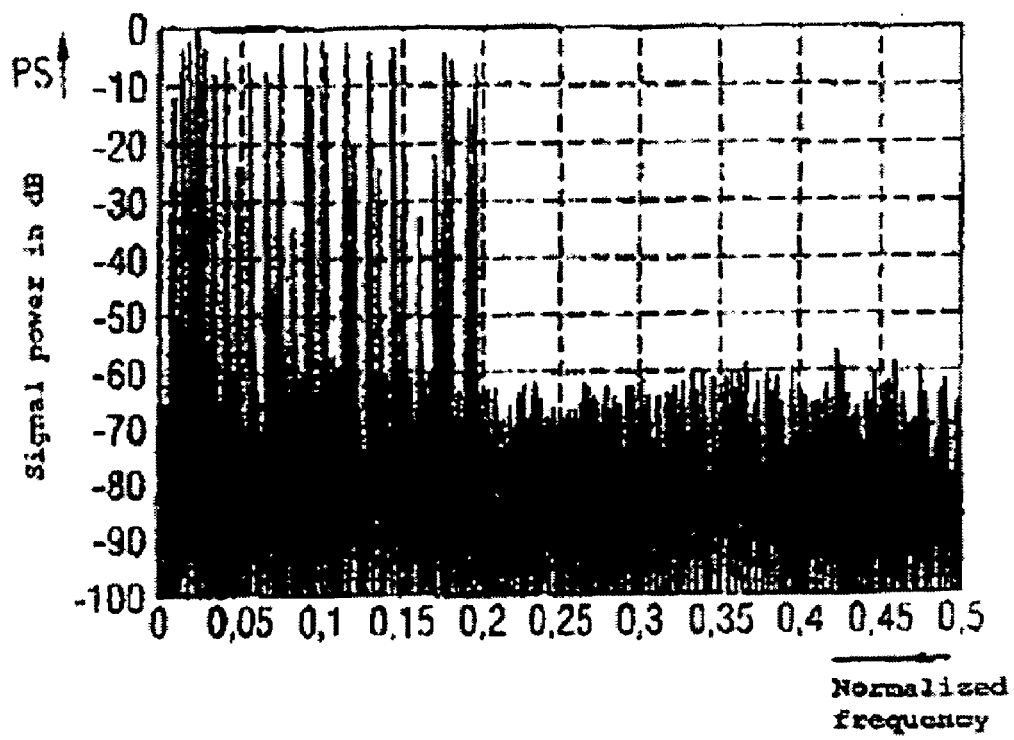
FIGS. 7($a$)-7($c$) show a simulation of the output spectrums for various time interleaved analog-to-digital converters.
Figure 7B:
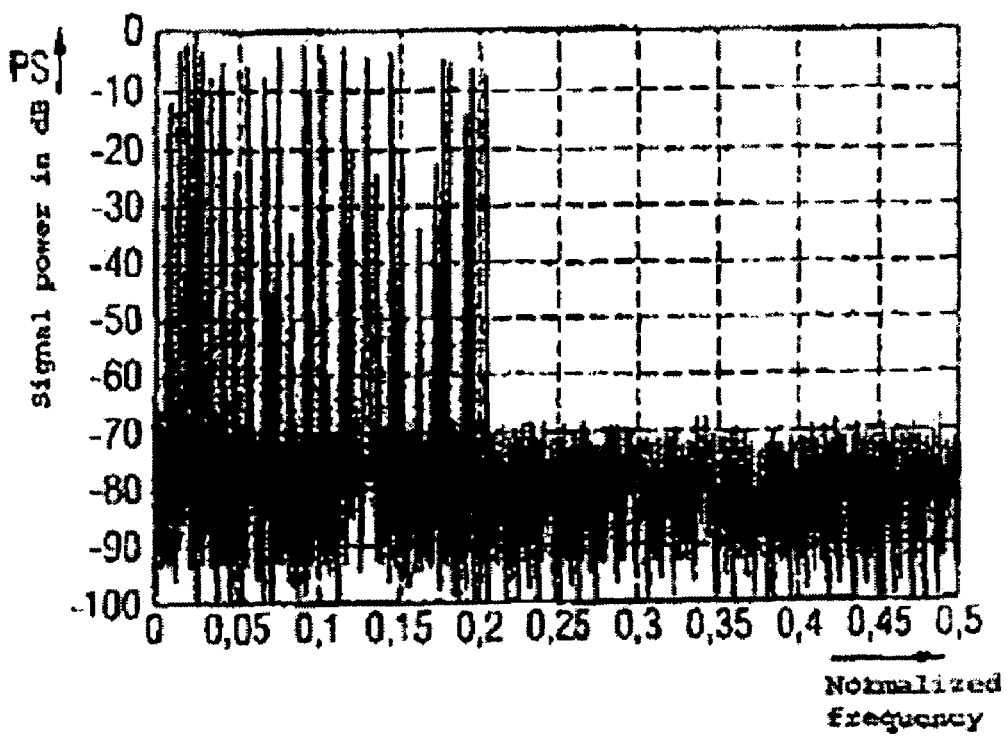

FIGS. 7(a)-(c) show a simulation of the output spectrum of a time interleaved analog-to-digital converter, with no spectral optimization having been used in FIG. 7(a), and spectral optimization being used in FIG. 7(b) using what is referred to as randomization. FIG. 7(c) shows spectral optimization using the circuit arrangement according to the invention. A multitone signal was used for actuation in each of the examples. The abscissa shows here the normalized frequency as far as the central pin fs/2. The output spectrum PS of the output signal XOUT is represented on the ordinate in dB. The useful band lies in the range of o to approximately 0.2 of the normalized frequency.

It is apparent that the level of the interference signals in FIG. 7(a), that is to say without any optimization at all, is approximately −60 dB. In contrast to this, the level of the interference signals when the randomization method is used (FIG. 7(b)) is forced to approximately −68 dB over the entire frequency range. The interference level in the useful band is reduced to approximately below −80 dB by means of the circuit arrangement according to the invention, that is to say using an optimized sequence of the individual ADCs. This interference level was shifted according to the invention to higher frequencies, that is to say to frequencies above the useful band, but this is not critical for data processing and in particular for quality of the analog-to-digital conversion.

The following method according to the invention can be used in order to find an optimized sequence of the individual ADCs 15-1 to 1.5-4 of the converter array 14 with the above-mentioned properties. This method according to the invention optimizes the sequence and thus the order of the individual ADCs 15-1 to 15-4 in accordance with a specific incorrect adaptation parameter, for example the amplification, in order to shift the undesired power of an interference spectrum to higher frequencies. However, it is basically to be noted that the method according to the invention supplies only a sequence for the actuation of the individual ADCs 15-1 to 15-4 but any sequence which has the comparable Fourier transformation generates identical spectral shapes. These are, in particular, rotations and mirror inversions of the sequence supplied by the sorting method according to the invention.

A first sorting method according to the invention for performing spectral shaping of the output spectrum and for determining an optimized channel sequence will be described below. This sorting method according to the invention reorders the parameters to be taken into account, for example the amplification or the timing error, as follows:

(A) Initialization of X and Y:
X=(a, b) refers to a sequence of individual analog-to-digital converters which are each composed of a parameter a (for example the gain) and the associated index b, for example in the case of four individual analog-to-digital converters: ADC0=(0.9; 1), ADC1=(1.3; 2), ADC2= (1.2; 3), ADC3=(1.02; 4). Each of these X values is therefore assigned to one of the individual analog-to-digital converters ADC0-ADC1. Y={ } refers to am empty sequence.

(B) Execution:
As long as the number of elements x is unequal to 0, carry out the following program loop:
Take the element with the largest parameter a from X and add it to Y to the right of the element.
Take the element with the smallest parameter a from X and add it to Y to the left of the element.
Take the element with the largest parameter a from X and add it to Y to the left of the elements.
Take the element with the smallest parameter a from X and add it to Y to the right of the elements.

(C) Result:
The newly ordered elements whose indices predefine the new converter sequence are now in Y. The following is obtained for this sequence: Y={ADC2, ADC0, ADC1, ADC3}

Figure 8:
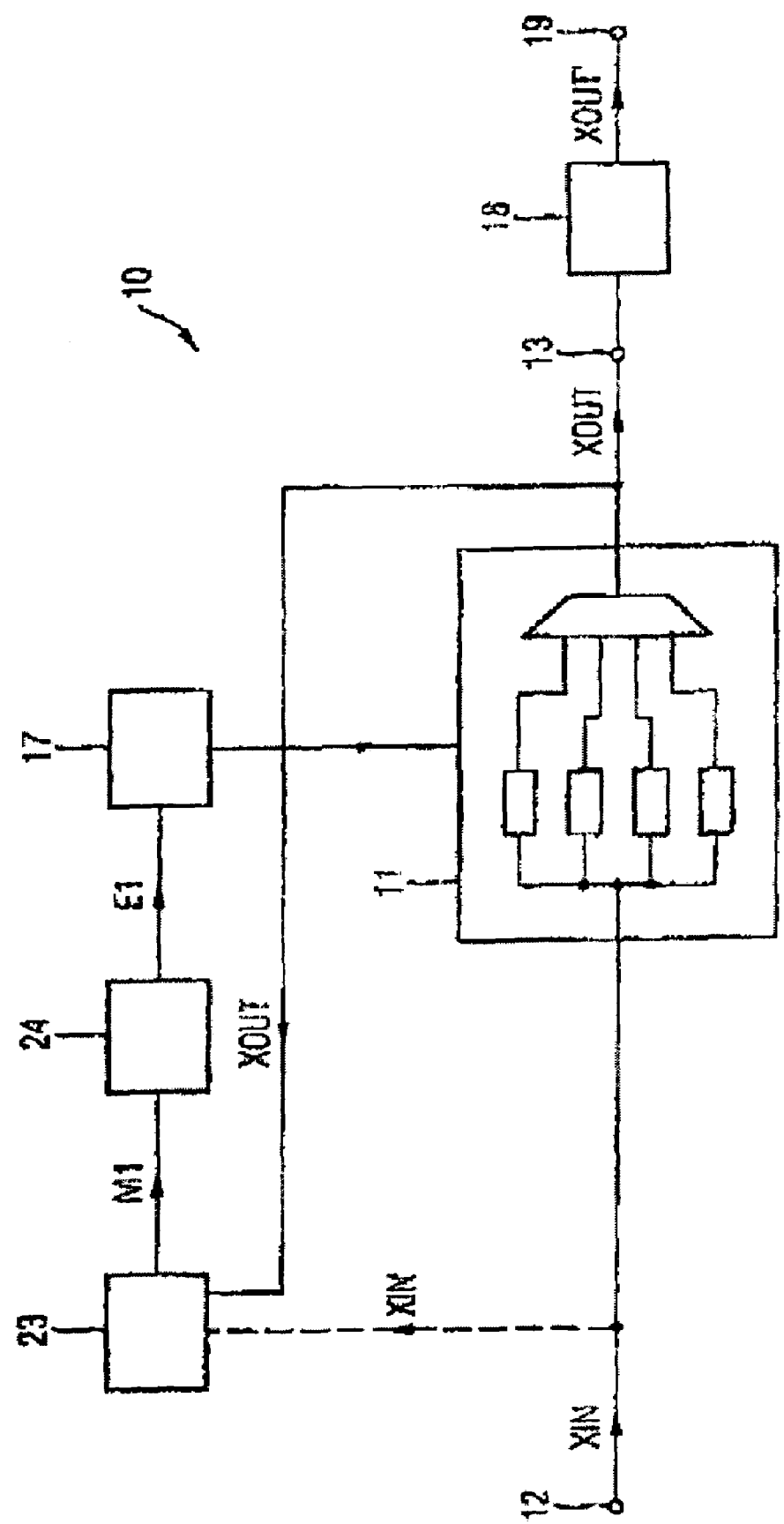
FIG. 8 shows a third, preferred exemplary embodiment of a circuit arrangement according to the invention.

FIG. 8 shows a third, particularly preferred exemplary embodiment of a circuit arrangement according to the invention. In contrast to the circuit arrangements in FIGS. 3 and 5, this circuit arrangement 10 additionally contains a measuring device 23 and an evaluation device 24 which is connected downstream of the measuring device 23 at the output end. For example, a program controlled device such as, for example, a microprocessor or a microcontroller can be used as the evaluation device 24. The output signal XOUT or additionally or alternatively also the input signal XIN (represented by dashed lines) can be fed to the measuring device 23. The measuring device 23 is configured to pick up the spectrum of this signal XIN, XOUT and feed a signal derived therefrom to the evaluation device 24 connected downstream. The evaluation device 24 evaluates the respectively picked-up spectrums and correspondingly actuates the connection network 17 in order to be able to implement an optimum converter sequence of the individual analog-to-digital converters 15-1 to 15-4 by means of the connection network 17 on the basis of the information acquired from tile spectrums.

The particular advantage consists in the fact that specific parameters which are responsible for an incorrect adaptation of the spectrum can already be determined by means of the circuit arrangement according to the invention in FIG. 8 while the analog-to-digital converter 11 is operating and the converter sequence can be optimized using this knowledge. In particular, it is possible to provide here that after a predefined time for example or whenever the analog-to-digital converter 11 is reactivated the sequence of its individual analog-to-digital converters 15-1 to 15-4 is newly checked and if appropriate adapted to the changed conditions. This configuration is of particular advantage if the incorrect adaptation of the individual analog-to-digital converters comes about as a result of a time-variant parameter, that is to say is a function of time. In this case, after a corresponding time a new correction of the incorrect adaptation can be performed by redefining axe optimized sequence of the individual analog-to-digital converters 15-1 to 15-4.

If, on the other hand, the incorrect adaptation is invariant with respect to time, for example as a result of a technology-related, permanently incorrect parameter, for example a time offset error or an amplification error, such a measuring device 23 and evaluation device 24 are not necessary. In these cases, a circuit arrangement corresponding to FIGS. 3 and 5 is sufficient since here an optimized sequence of the individual analog-to-digital converters 15-1 to 15-4 only has to be implemented once. If this optimized sequence is fixed, it is also unnecessary to change it. This can be carried out any time while an analog-to-digital converter is operating. Additionally or alternatively, this can also be done while the analog-to-digital converter 11 is being fabricated. During the fabrication of the analog-to-digital converters 11 it is possible, for example by measuring, to determine the respective parameters which are used to determine the optimized sequence. After this it is still possible to generate the corresponding connection lines for the connection network, for example by additional diffusion, during the fabrication process for manufacturing the analog-to-digital converter 11. Additionally or alternatively the connection network can also be set suitably by respectively controlled switches.

Figure 9:
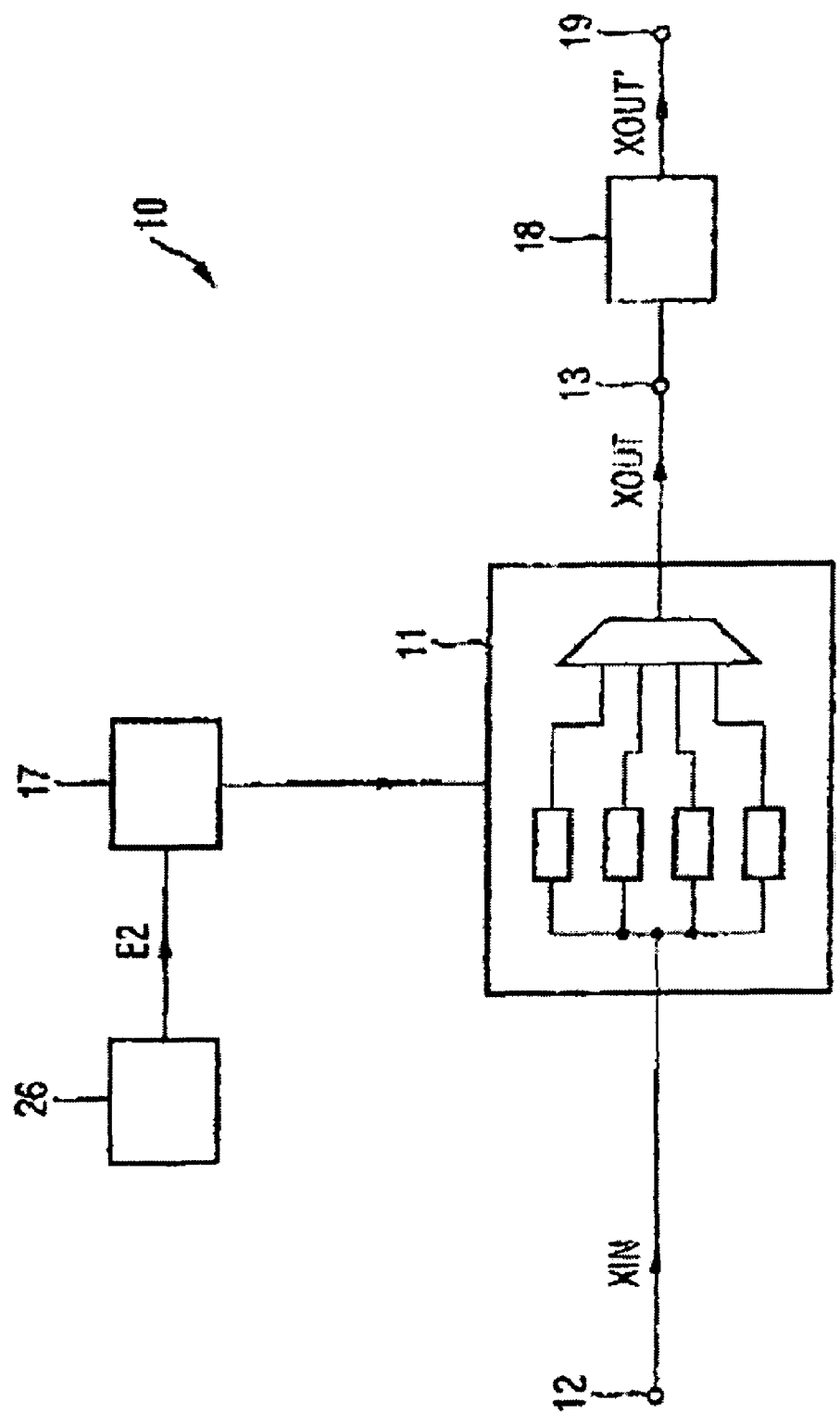
FIG. 9 shows a fourth, particularly preferred exemplary embodiment of a circuit arrangement according to the invention.

FIG. 9 shows a fourth, particularly preferred exemplary embodiment of a circuit arrangement according to the invention. In contrast to the circuit arrangement in FIG. 8, there is no closed-loop control means provided here but instead an open-loop control device 26. The open-loop control device 26 is configured to make available control signals 82 for controlling the connection network 17 and for setting the settings or parameters of the connection network 17. The method of operation of the open-loop control device 26 will be explained below in more detail with reference to two exemplary embodiments.

Figure 10:
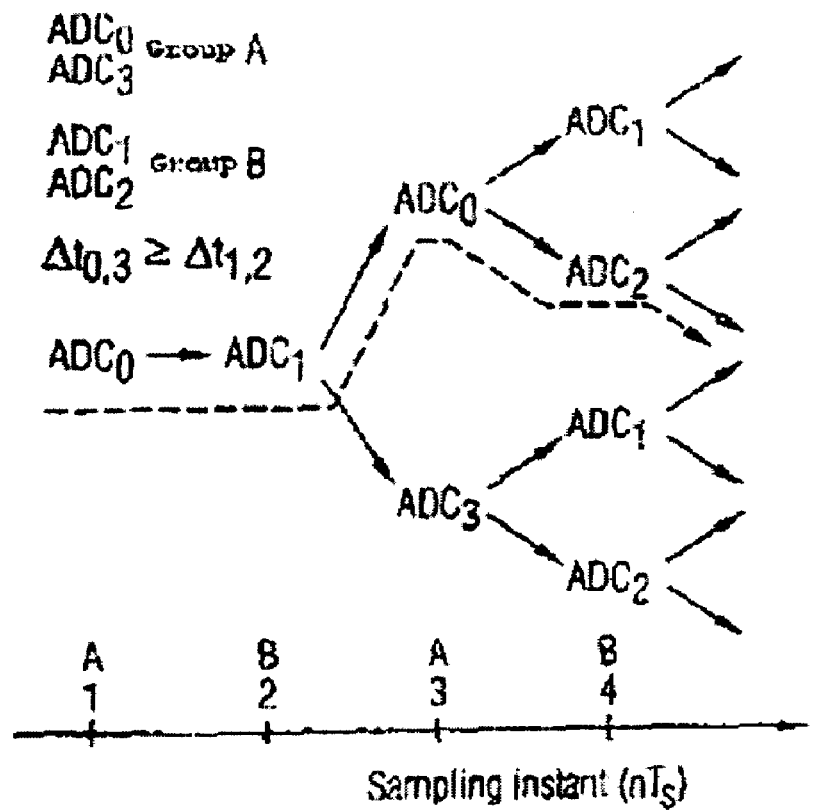
FIG. 10 is a schematic illustration of a second method according to the invention.

In addition to the very simple, first method, already described above, for determining an optimized channel sequence, two further, likewise very advantageous; methods for determining an optimized channel sequence are described below:

For a representation of the second method, reference is made to FIG. 10. It is assumed that the converter array has four individual analog-to-digital converters which are divided into two groups A, B. The first group A contains the individual analog-to-digital converters ADC0, ADC3, and the second group B contains the individual analog-to-digital converters ADC1, ADC2. The two groups A., B differ, for example, in that the individual analog-to-digital converters contained in them have different incorrect time adaptations $\Delta t_{0,3} \geqq \Delta t_{1,2}$ (time offset). The two groups A, B therefore each contain individual analog-to-digital converters with different channel properties. In order to determine an optimized channel sequence, individual analog-to-digital converters of the first group A and individual analog-to-digital converters of the second group B are then selected alternately. After the individual analog-to-digital converters ADC0 and ADC1 have been selected from the first two groups in the first and second selection cycles (sampling instant nTs), the individual analog-to-digital converter ADC0 is then selected from the first group A in the third selection cycle. In the fourth selection cycle, the individual analog-to-digital converter ADC2 is selected from the second group B. The selection of the individual analog-to-digital converters within a group is carried out randomly here so that a certain degree of randomization takes place here within a respective group A, B. The dashed line in FIG. 10 shows the optimized channel sequence determined by the second method according to the invention, that is to say by randomization within a respective group A, B.

With the method according to the invention just described, the output spectrum can be subject to spectral shaping onto the central pin, that is to say onto the frequency fs/2, but differently configured spectral shaping, for example onto the 3*fs/4-pin, the 5*fs/4-pin, etc. would also be possible here.

The method just presented was described with reference to only two groups with two individual analog-to-digital converters each, but this could also be extended as desired in particular, when there are more than four individual analog-to-digital converters, the individual groups can also contain more than two individual analog-to-digital converters, while it is not necessarily the case that identical numbers of individual analog-to-digital converters have to be provided in each group. For example, more than two groups would also be conceivable. The assignment to the respective groups can also be performed using other parameters, for example a time offset error, an amplification error etc.

After the optimum channel sequence has been determined, this can then be used permanently for the analog-to-digital conversion. Alternatively, it is also possible to provide for a new, optimized channel sequence to be determined again for each conversion cycle by means of the method described above. This channel sequence which is determined in this way can then be set continuously, for example by means of the open-loop control device 26 in the connection network 17 (see FIG. 9).

The third method for determining optimized channel sequences is described below.

It is assumed that there are a plurality of channel sequences which each satisfy the requirements of an optimized channel sequence with respect to one or more predefined parameters. This is to be understood as meaning that for each of these optimized channel sequences the output spectrum is shifted to a greater or lesser extent to regions within the useful band, in which case here it is not necessarily the case that shifting to the central fs/2-pin has to be necessary.

In each case a group contains, for example, four individual analog-to-digital converters. In order to determine these groups (optimized channel sequence), the first and second methods described above can be used or else other suitable methods can be applied. The illustration of the third method according to the invention will be described below with reference to the following three groups and the illustration in FIG. 11:

| Group 1: | ADC2, ADC3, ADC0, ADC4; |
| Group 2: | ADC0, ADC3, ADC2, ADC3; |
| Group 3: | ADC1, ADC3, ADC1, ADC0. |

The third method according to the invention then provides that one of the three groups above is used for the conversion for, for example, each conversion cycle or else for a predefined time which of the three groups is selected here is determined randomly. It is also possible in this context to provide additionally for a group which is currently being used to be excluded from consideration for the selection of a new group so that in the present example a group is then selected from the two other groups.

Figure 11:
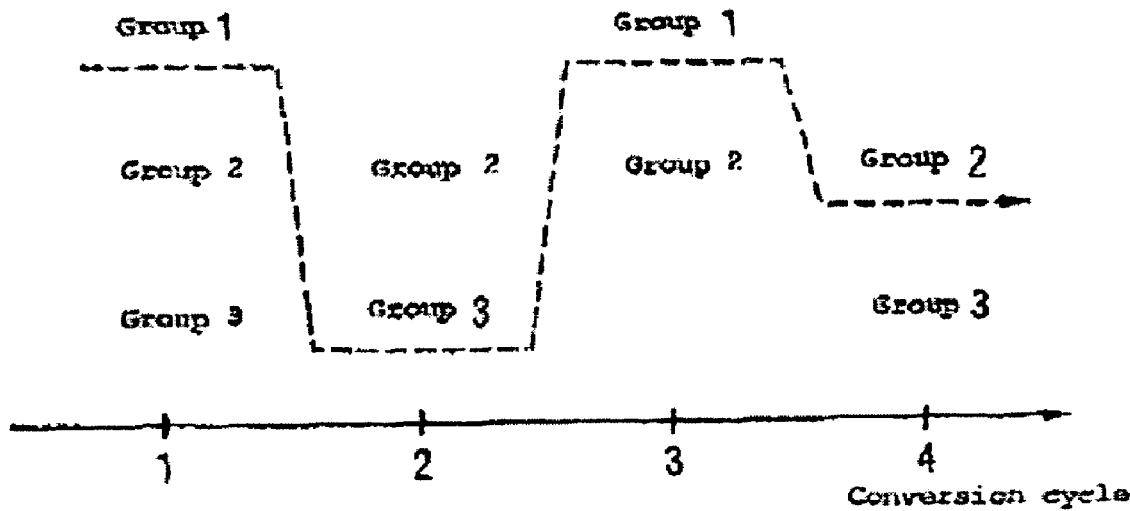
FIG. 11 is a schematic illustration of a third method according to the invention.

An example will be described with reference to FIG. 11. In the first conversion cycle, the individual analog-to-digital converters of the first group have been selected in the second conversion cycle, it is therefore possible to select the individual analog-to-digital converters of the second group ox of the third group, with the third group having been selected here. In the same way, the first and second groups are then randomly selected for the third or fourth conversion cycle. The dashed line in FIG. 11 shows the sequence for the groups used for the analog-to-digital conversion, said sequence having been determined by randomization. The channel sequences which are respectively determined in this way can then be set, for example, by means of the open-loop control device in the connection network 17 (see FIG. 9).

As a result of this random selection of the groups used for the conversion or the corresponding individual analog-to-digital converters, it is possible, as it were, to implement a means for forming average values in which spectral shaping of the output spectrum onto the fs/2-pin is implemented.

In the method according to the invention described above it has always been assumed that the sequence of all the individual analog-to-digital converters of a converter array is in, fact determined by these methods. However, the invention is not restricted to this. Instead, these methods can also be combined with one another.

Although the present invention has been described above with reference to preferred exemplary embodiments, it is not restricted to them but rather can be modified in a variety of ways.

The present invention is thus not restricted to the present numerical data, which has merely been specified for the sake of better illustration. In particular, the circuit arrangement according to the invention with time interleaved analog-to-digital converters is not restricted to using one converter array with four individual analog-to-digital converters but rather can also be advantageously used with three individual analog-to-digital converters or any desired higher number of individual analog-to-digital converters.

The method according to the invention is also not necessarily restricted to the sorting methods described above, in which spectral shaping of the spectrum of the output signal is performed. Instead, these constitute methods which are preferred but do not have to be used exclusively.

The present invention is also not restricted to the specific design of the analog-to-digital converters in FIGS. 3, 5, 8, 9 but rather can of course be modified suitably and changed in a variety of ways without departing from the fundamental principle of the invention. Even if the invention has been explained with reference to non-differential signal paths, it is of course also possible to select differential designs without departing from the fundamental principle of the invention. In addition, converter arrays are also possible which use the invention and in which a plurality of signal processing stages are provided between the formation of the output signal by the multiplexer and the input-end branches of the analogue input signal to parallel converter channels.

Although a logic circuit which is formed as a multiplexer is provided for generating the digital output signal XOUT in order to connect together the digital intermediate signals generated by the individual analog-to-digital converters, alternative implementations are also conceivable. In particular, a logic circuit can perform preprocessing of the digital intermediate signals in order, for example, to reduce the data density in the individual channels of the converter array. It is also possible to buffer the digital intermediate signals and to combine the intermediate signals by means of software in order to form the digital output signals.

Although modifications and changes may be suggested by those skilled in the art, it is the intention of the inventors to embody within the patent warranty heron all changes and modifications as reasonably and properly come within the scope of their contribution to the art.

We claim:

1. An analog-to-digital converter arrangement, comprising:
    an analog-to-digital converter for converting an input signal (XIN) into a digital outout signal, said analog-to-digital converter operating with staggered timing and comprising a converter array having a plurality of individual analog-to-digital converters (15-1 to 5-4) being arranged in a fixed sequence in parallel with one another and operable with staggered timing with respect to one another; and
    a connection network configured to generate, for a staggered timing actuation, a control signal for each of said individual analog-to-digital converters (CLKI'-CLK4'), said connection network predefining a time sequence with which said control signals (CLKI'-CLK4') actuate said individual analog-to-digital converters in such a way that owing to said sequence and thus the sequence of said actuated individual analog-to-digital converters there is at least a reduction in an interference spectrum in the spectrum of said digital output signal (XIN, XOUT);
    wherein said connection network comprises a counter being triggered by a central clock signal (CLK) and generating a counter sequence (Z1), and wherein each of said individual analog-to-digital converters comprises connected upstream on the control side at least one actuation circuit which assigns a counter reading of the counter sequence generated by the counter to each individual analog-to-digital converter, in each case as a control signal (CLK1'-CLK4').

2. The converter arrangement of claim 1, wherein said actuation circuit comprises in each case a memory register and a comparator, each of said comparators being configured to compare said counter sequence (Z1) with a register content being stored a respective of said memory registers.

3. A converter arrangement of claim 1, further comprising a measuring device having a measuring output, said measuring device determining at least one of the properties of said individual analog-to-digital converters or the parameters which influence said spectrum and providing, at said measuring output, a respective measurement signal.

4. The converter arrangement of claim 3, wherein said measuring device is configured to pick-up at least one of said input signal (XIN) or said output signal and to determine the spectrum of these signals (XIN, XOUT) therefrom for determining the properties of the individual analog-to-digital converters and/or for determining the parameters which influence the spectrum.

5. The converter arrangement of claim 1, wherein said connection network comprises at least a clock input into which at least a clock signal (CLK, CLK1-CLK4) can be input, said connection network generating, from said input clock signals (CLK, CLK1-CLK4), clocked control signals as said control signals, said clock control signals having a predetermined time difference with respect to one another and being used to actuate said individual analog-to-digital converters (15-1 to 15-4).

6. The converter arrangement of claim 1, further comprising at least three as said individual analog-to-digital converters each being connected by their signal path to an input of said converter arrangement to pick-up an analogue input signal (XIN) present at said input, sample said picked-up input signal (XIN) and convert the sampled signal input signal (XIN) to digital intermediate signals (Z-1 to Z-4).

7. The converter arrangement of claim 1, further comprising at least four as said individual analog-to-digital converters each being connected by their signal path to an input of said converter arrangement to pick-up an analogue input signal (XIN) present at said input, sample said picked-up input signal (XIN) and convert picked-up input signal (XIN) to digital intermediate signals (Z-1 to Z-4).

8. The converter arrangement of claim 1, further comprising a filter connected downstream of said converter arrangement, said filter filtering said output signal (XOUT) to filter out an energy from undesired interference spectrums, present in addition to a wanted spectrum, from a spectrum of said output signal (XOUT).

9. The converter arrangement of claim 8, wherein said filter is a low-pass filter.

10. The converter arrangement of claim 1, wherein said connection network comprises fixed connecting devices.

11. The converter arrangement of claim 1, wherein said connection network comprises variable connection devices which can be varied by means of controllable switches.

12. A analog-to-digital converter comprising:
    an analog-to-digital converter for converting an input signal (XIN) into a digital outout signal, said analog-to-digital converter operating with staggered timing and comprising a converter array having a plurality of individual analog-to-digital converters (15-1 to 5-4) being arranged in a fixed sequence in parallel with one another and operable with staggered timing with respect to one another;
    a connection network configured to generate, for a staggered timing actuation, a control signal for each of said individual analog-to-digital converters (CLKI'-CLK4'), said connection network predefining a time sequence with which said control signals (CLKI'-CLK4') actuate said individual analog-to-digital converters in such a way that owing to said sequence and thus the sequence of said actuated individual analog-to-digital converters there is at least a reduction in an interference spectrum in the spectrum of said digital output signal (XIN, XOUT);
    a measuring device having a measuring output, said measuring device determining at least one of the properties of said individual analog-to-digital converters or the parameters which influence said spectrum and providing, at said measuring output, a respective measurement signal; and an evaluation device evaluates a measurement signal (M1) of the measuring device and generates, as a function of this evaluation, setting signals (E1) four actuating and setting in an optimum way the connections of the connection network.

13. An analog-to-digital converter arrangement comprising an analog-to-digital converter for converting an input signal (XIN) into a digital output signal, said analog-to-digital converter operating with staggered timing and comprising a converter array having a plurality of individual analog-to-digital converters (15-1 to 15-4) being arranged in a fixed sequence in parallel with one another and operable with staggered timing with respect to one another;

a connection network configured to generate, for a staggered timing actuation, a control signal for each of said individual analog-to-digital converters (CLKI'-CLK4'), said connection network predefining a time sequence with which said control signals (CLKI'-CLK4') actuate said individual analog-to-digital converters in such a way that owing to said sequence and thus the sequence of said actuated individual analog-to-digital converters there is at least a reduction in an interference spectrum in the spectrum of said digital output signal (XIN, XOUT); and a first group of individual analog-to-digital converters is provided in which the sequence of the individual analog-to-digital converters is assigned in accordance with a reduction in an interference spectrum in the spectrum (PS) of the input signal (XTN) and/or output signal (XOUT), and at least a second group of individual analog-to-digital converters is provided in which an assignment of the sequence of the individual analog-to-digital converters is provided.

14. A sorting method for operating a converter arrangement for spectral shaping of the spectrum of an output signal (XOUT), comprising the steps:

(a) a providing a converter array having a plurality of individual analog-to-digital converters are arranged in a fixed sequence and in parallel with one another:

(b) determining at least a parameter for an optimum sequence of the individual analog-to-digital converters within the converter array;

(c) assigning a sequence of the individual analog-to-digital converters with which they are actuated with staggered timing accordance with the determined narameter or parameters; and wherein a first group and at least a second group of individual analog-to-digital converters are provided, with alternate individual analog-to-digital converters of the first group and of the second group being selected for a determination of an optimized sequence of the individual analog-to-digital converters, and in that the selection of an individual analog-to-digital converter is carried out randomly within a respective group.

15. The method of claim 14, wherein the determined parameters are derived from the properties of the individual analog-to-digital converters.

16. The method, of claim 14, wherein the determined parameters are derived from the input signal (XIN) and/or the output signal (XOUT) by determining and evaluating the spectrum (PS) of the output signal (XOUT).

17. The method of claim 14, wherein the determined parameters are derived from the amplification, the time offset, the sampling time and/or the bandwidth of the individual analog-to-digital converters.

18. A sorting method for operating a converter arrangement for spectral shaping of the spectrum of an output signal (XOUT), comprising the steps:

(a) providing a converter array having a plurality of individual analog-to-digital converters are arranged in a fixed sequence and in parallel with one another;

(b) determining at least a parameter for an optimum sequence of the individual analog-to-digital converters within the converter array;

(c) assigning a sequence of the individual analog-to-digital converters with which they are actuated with staggered timing accordance with the determined parameter or parameters; and further characterized in that a plurality of groups of optimized sequences are made available for the individual analog-to-digital converters of a converter array, with a new group for the successive conversion cycle or cycles being selected randomly after a predetermined number of conversion cycles, in particular after each conversion cycle.

19. A sorting method for operating a converter arrangement for spectral shaping of the spectrum of an output signal (XOUT), comorising the steps:

(a) providing a converter array having a plurality of individual analog-to-digital converters are arranged in a fixed sequence and in parallel with one another;

(b) determining at least a parameter for an optimum sequence of the individual analog-to-digital converters within the converter array; and (c) assigning a sequence of the individual analog-to-digital converters with which they are actuated with staggered timing accordance with the determined parameter or parameters; and wherein at least a first group of individual analog-to-digital converters is provided, with the sequence of the individual analog-to-digital, converters being assigned in accordance with the determined sequence, in accordance with a reduction in an interference spectrum in the spectrum of the input signal (XIN) and/or output signal (XOUT), and at least a second group of individual analog-to-digital converters is provided in which the sequence of the individual analog-to-digital converters is assigned according to the randomization method.

* * * * *